(12) United States Patent
Edelstein et al.

(10) Patent No.: US 9,070,686 B2
(45) Date of Patent: Jun. 30, 2015

(54) WIRING SWITCH DESIGNS BASED ON A FIELD EFFECT DEVICE FOR RECONFIGURABLE INTERCONNECT PATHS

(75) Inventors: Daniel C. Edelstein, White Plains, NY (US); Stephen M. Gates, Ossining, NY (US); Ramachandran Muralidhar, Mahopac, NY (US); Thomas N. Theis, Croton on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 106 days.

(21) Appl. No.: 13/479,946

(22) Filed: May 24, 2012

(65) Prior Publication Data

US 2012/0306017 A1 Dec. 6, 2012

Related U.S. Application Data

(63) Continuation-in-part of application No. 13/149,797, filed on May 31, 2011, now Pat. No. 8,624,323.

(51) Int. Cl.
*H01L 29/78* (2006.01)
*H01L 23/525* (2006.01)
*H01L 27/12* (2006.01)
*H03K 19/173* (2006.01)

(52) U.S. Cl.
CPC ............ *H01L 23/525* (2013.01); *H01L 27/124* (2013.01); *H03K 19/1736* (2013.01); *H01L 2924/0002* (2013.01)

(58) Field of Classification Search
CPC ......... H01L 29/78; H01L 29/00; H01L 29/80; H01L 23/498
USPC ......... 257/365, 7, 24, 27, 133, 192, 213, 334, 257/337, 357, 368, 499, 491, 663, 723, 713
See application file for complete search history.

(56) References Cited

U.S. PATENT DOCUMENTS

| | | |
|---|---|---|
| 4,240,097 A | 12/1980 | Raymond |
| 4,939,568 A | 7/1990 | Kato et al. |
| 5,859,456 A | 1/1999 | Efland |
| 6,821,826 B1 | 11/2004 | Chan et al. |
| 7,312,487 B2 | 12/2007 | Alam et al. |
| 7,518,189 B1 | 4/2009 | Hackler, Sr. et al. |
| 7,723,207 B2 | 5/2010 | Alam et al. |
| 8,441,038 B1 * | 5/2013 | Trimberger .................. 257/209 |
| 2006/0036976 A1 * | 2/2006 | Cohn et al. ......................... 716/4 |
| 2006/0274569 A1 * | 12/2006 | Joshi et al. ..................... 365/154 |
| 2008/0130200 A1 * | 6/2008 | Edelstein et al. ............. 361/330 |
| 2008/0283875 A1 * | 11/2008 | Mukasa et al. ................ 257/253 |
| 2008/0293175 A1 * | 11/2008 | Torii ............................... 438/30 |
| 2010/0081232 A1 | 4/2010 | Furman et al. |
| 2012/0306018 A1 * | 12/2012 | Gates et al. .................... 257/368 |

* cited by examiner

*Primary Examiner* — Chuong A Luu
(74) *Attorney, Agent, or Firm* — Louis J. Percello, Esq.; McGinn IP Law Group, PLLC

(57) ABSTRACT

An integrated circuit, including a substrate, at least one metal wiring layer disposed above the substrate. The metal wiring layer including a wiring switch and a plurality of patterned conductors. The wiring switch including a back gate field effect transistor (BGFET).

20 Claims, 13 Drawing Sheets

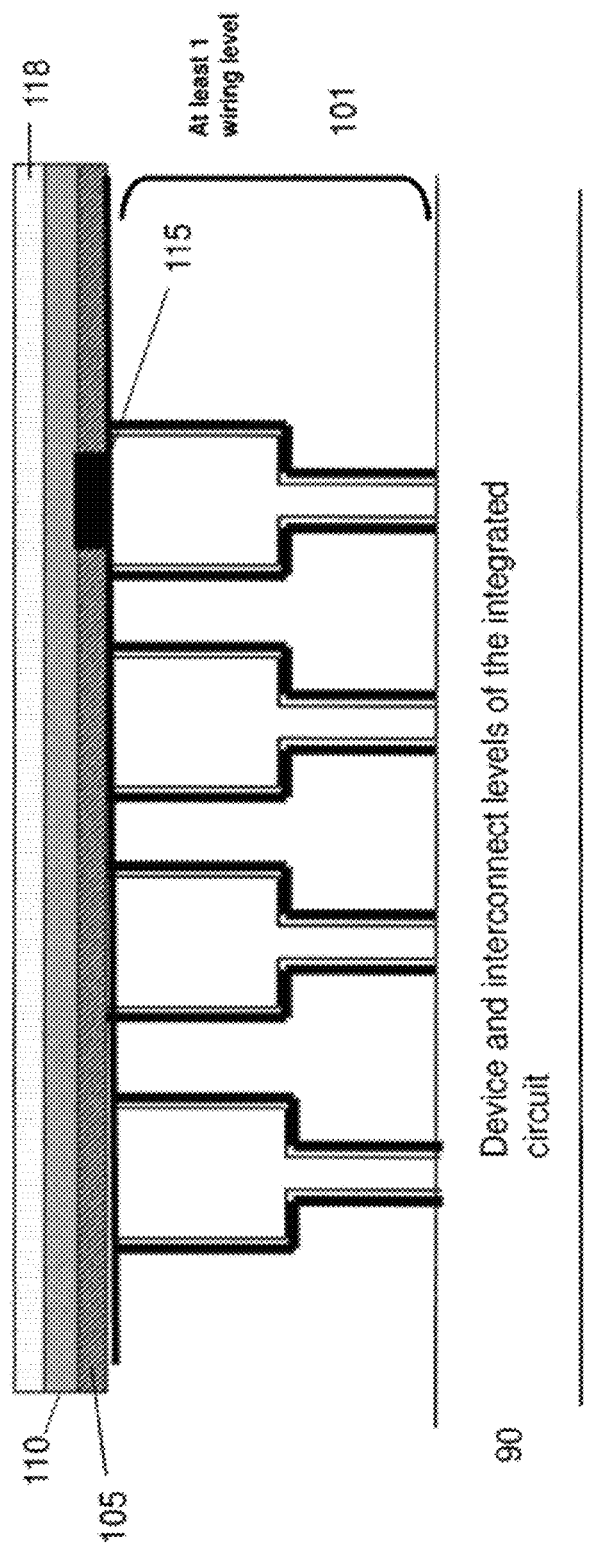

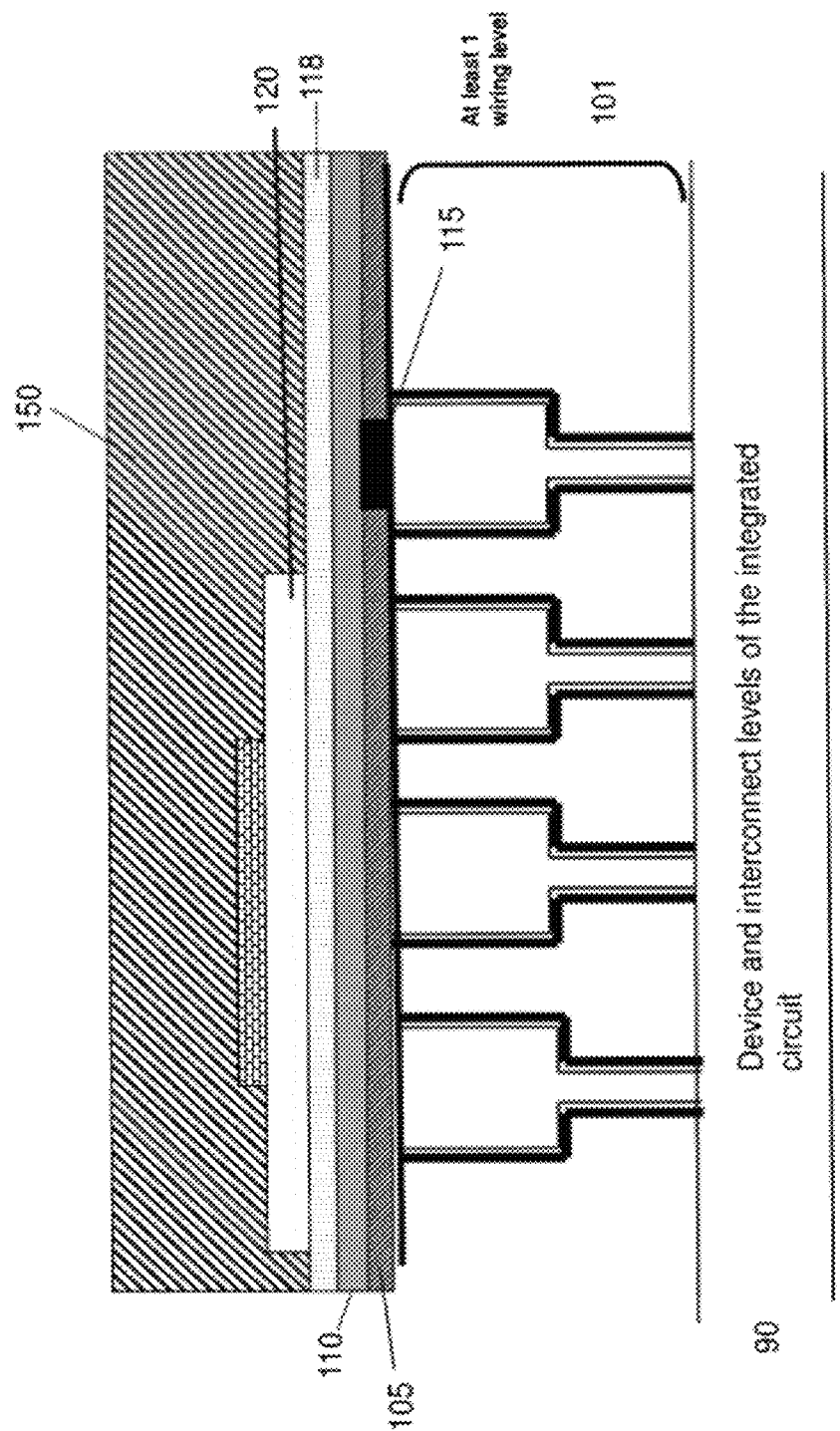

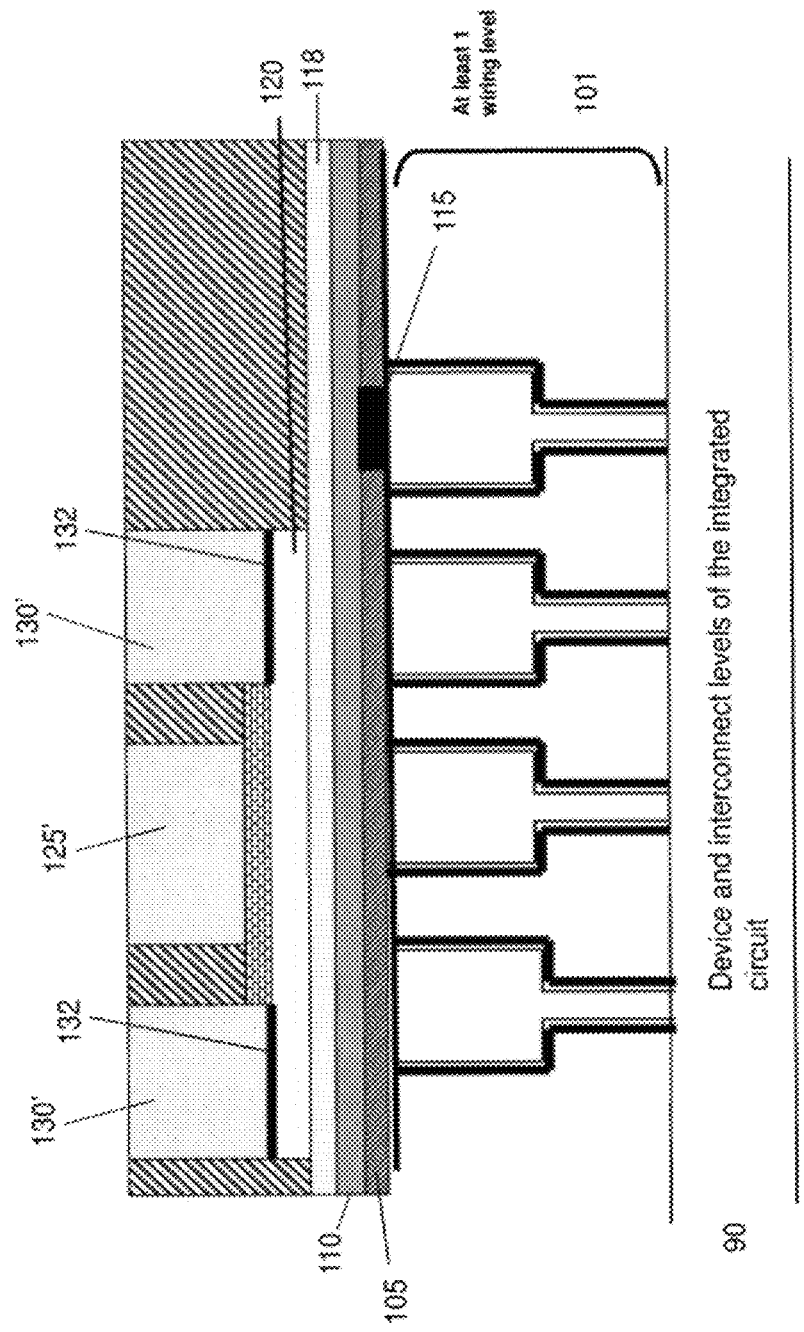

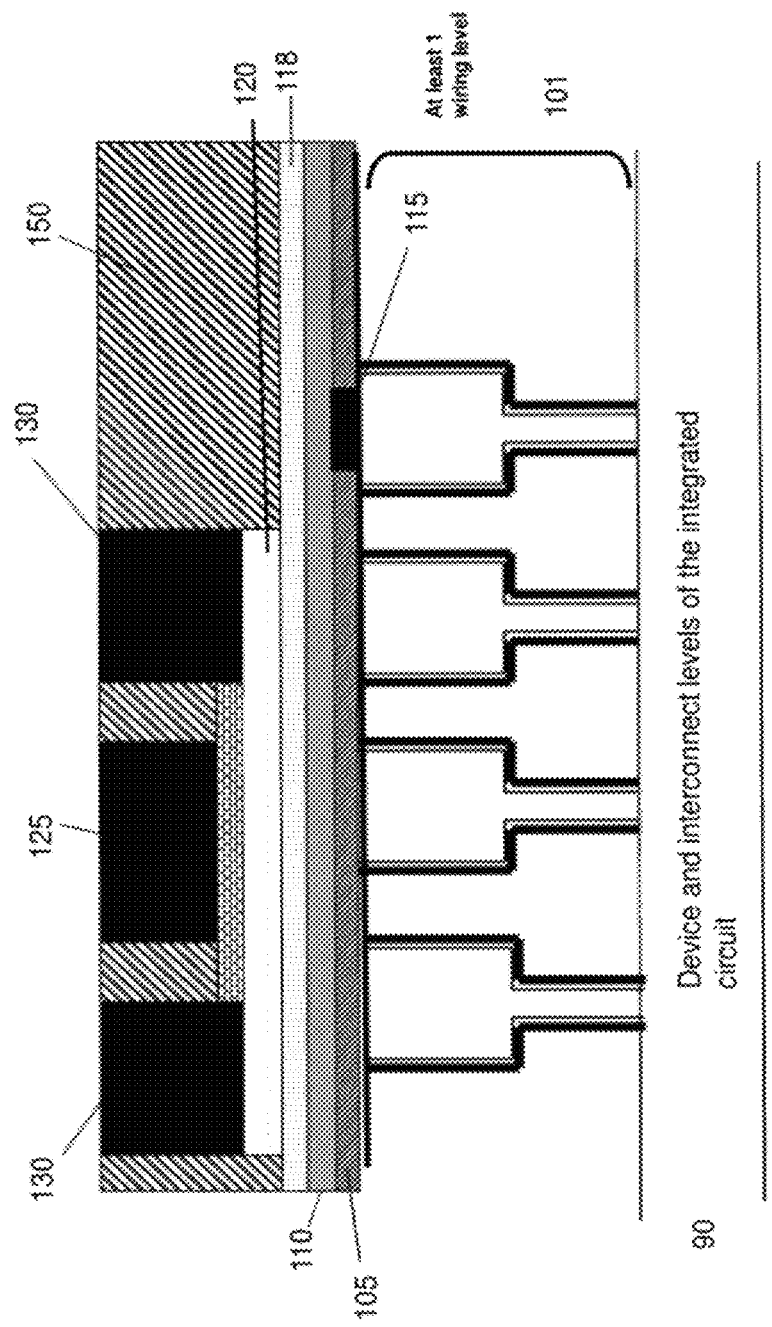

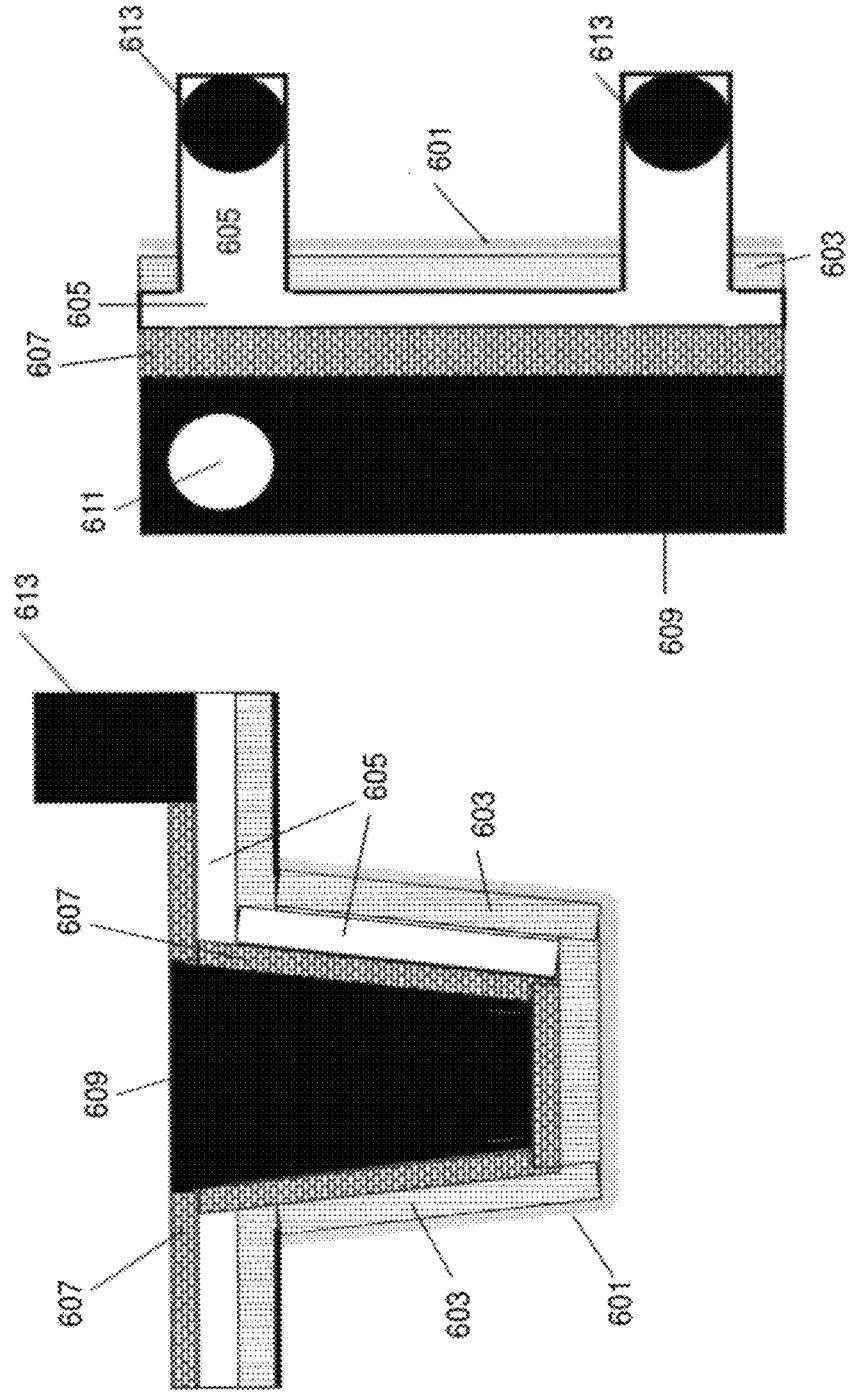

WIRING SWITCH DESIGNS BASED ON A FIELD EFFECT DEVICE FOR RECONFIGURABLE INTERCONNECT PATHS

The present application is a continuation-in-part Application of U.S. application Ser. No. 13/149,797, filed on May 31, 2011 now U.S. Pat. No. 8,624,323, the entire contents of which is incorporated herein by reference.

BACKGROUND OF THE INVENTION

1. Field of the Invention

The present invention generally relates to integrated circuits and a method of fabrication thereof, and more particularly, but not by way of limitation, to a wiring level of an integrated circuit in a back-end-of line processing.

2. Description of the Related Art

There has been a progressive trend toward miniaturizing electrical components though dimension scaling, thereby resulting in increased circuit density over time. The general manufacturing scheme of an integrated circuit (IC) can be divided into front-end-of-line (FEOL) processing and back-end-of-line (BEOL) processing.

Generally, in the FEOL processing, transistors and other active or nonlinear devices are formed on a semiconducting wafer surface, such as, for example, a Si wafer. In the BEOL processing, on the other hand, lower temperature processes are used to form multiple layers of interconnect wiring with damascene copper wiring being the most commonly used metallization process.

Conventional crystal and silicon devices require very high temperatures to form a transistor. For example, thermal growth of SiO2 requires approximately 1000° C. and dopant activation steps require from 600 to 1000° C. These steps at temperatures above 500° C. are incompatible with wiring fabrication, and therefore, the conventional technique is to form transistors in the FEOL, and then form the wiring interconnections in the BEOL using temperatures of 350-400° C. These limits and process order are critical to the success of conventional devices.

In conventional reprogrammable devices, known as a reprogrammable field programmable gate array (FPGA), the device takes advantage of a known method for reconfiguration of the chip. Specifically, a reprogrammable FPGA chip generally includes multiple logic elements (LE) or functional block units, wiring paths and programmable interconnections between the LEs. To properly function, connections are not only needed between the LEs and the wiring paths, but also between the wiring paths themselves.

These connections are formed through the programmable interconnections. For example, a programmable interconnection between two wires can be made by a pass transistor, e.g., a CMOS transistor, that is formed in the FEOL processing on the semiconducting wafer surface before the wiring paths are formed. The pass transistor's gate is controlled by a control voltage, which when high causes the pass transistor to become conductive and connect the two wiring paths. Likewise, when the control voltage is low, the transistor is off and the two wiring paths are not connected.

However, the pass transistor is not a perfect on-switch, which causes a large voltage drop across it, in turn leading to signal degradation, added power consumption, and/or lower speed at transmitting data through this switch.

In addition, in a conventional reprogrammable FPGA, a long wiring path exists to reach the pass transistor, said wiring path results in extra capacitance and significant resistance, which further slows down the device through RC delay.

As the size of the integrated circuit chip increases, so does the average interconnection wiring length. The increase in the average interconnect wiring length degrades the performance of the device via increased resistance and capacitance of the wires. As well, wire cross-sections scale down in more advanced technologies with smaller dimensions, increasing resistance per unit length even further.

Therefore, the present inventors have recognized that, there exists a need to decrease both the size of a conventional reconfigurable integrated circuit chip and its cost, while also increasing its performance.

SUMMARY OF THE INVENTION

In view of the foregoing and other exemplary problems, drawbacks, and disadvantages of the conventional methods and structures, an exemplary feature of the present invention is an integrated circuit, including a substrate, a metal wiring layer disposed above the substrate, the metal wiring layer including a wiring switch, the wiring switch being fabricated in a back end of line processing (BEOL) and including a back gate field effect transistor (BGFET), which is also known as a dual gate field effect transistor.

Another exemplary feature the present invention is an integrated circuit, including a substrate, a metal wiring layer formed on the substrate, a semiconductor active device layer disposed on the wiring layer, and a thin bodied switch including a back gate field effect transistor (BGFET), the thin bodied switch being fabricated in the semiconductor active device layer and in a back end of line (BEOL) processing.

Another exemplary feature of the present invention is a field programmable gate array (FPGA) including a plurality of wire segments, an array including a plurality of interconnections, and a non-linear semiconductor device disposed within the array, the plurality of wire segments being connected to the array, the plurality of interconnections and the plurality of wiring segments forming a plurality of reconfigurable conductive paths, the non-linear semiconductor being configured to modify a reconfigurable conductive path of the plurality of reconfigurable conductive paths. The non-linear semiconductor device includes a substrate, and a metal wiring layer disposed above the substrate, the metal wiring layer including a wiring switch, the wiring switch being fabricated in a back end of line processing (BEOL).

Another exemplary feature of the present invention is a method of fabricating an integrated circuit, the method including forming a first semiconductor layer from a substrate, fabricating at least one metal wiring layer above the substrate, forming at least one dielectric layer on the at least one metal wiring layer, forming a second semiconductor layer on the at least one dielectric layer, and fabricating, in a back end of line (BEOL) processing, a back gate field effect transistor (BGFET) in the second semiconductor layer.

As was noted above, switches are not provided in the BEOL processing in conventional devices. This is because of the intense heating, which is required for various process steps during the formation of the FET, including dopant activation, gate dielectric growth, and others, is incompatible with wiring fabrication.

The present invention, on the other hand, provides a switch in the BEOL processing. This switch may be used for modification of the interconnect wiring paths. Since the switch is provided in the BEOL processing the inventive integrated circuit may be smaller when compared to conventional technologies because area of the semiconducting wafer substrate is not required for the wiring switch. Having a smaller area, the yield can be increased over conventional devices. Also the length of wiring to connect to the inventive switch is reduced, thereby not only lessening the amount of parasitic resistance and capacitance, but also increasing the performance of the device. Hence, the present invention not only provides better performance than conventional technologies, but also does so at a lower cost.

There has thus been outlined, rather broadly, certain exemplary embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one exemplary embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 5A-5F illustrate a preferred method of fabricating the exemplary embodiment of the invention of FIG. 2;

FIGS. 6A-6B illustrate another exemplary embodiment of a vertical transistor BGFET of the invention;

DETAILED DESCRIPTION OF EXEMPLARY EMBODIMENTS OF THE INVENTION

Figure 1:
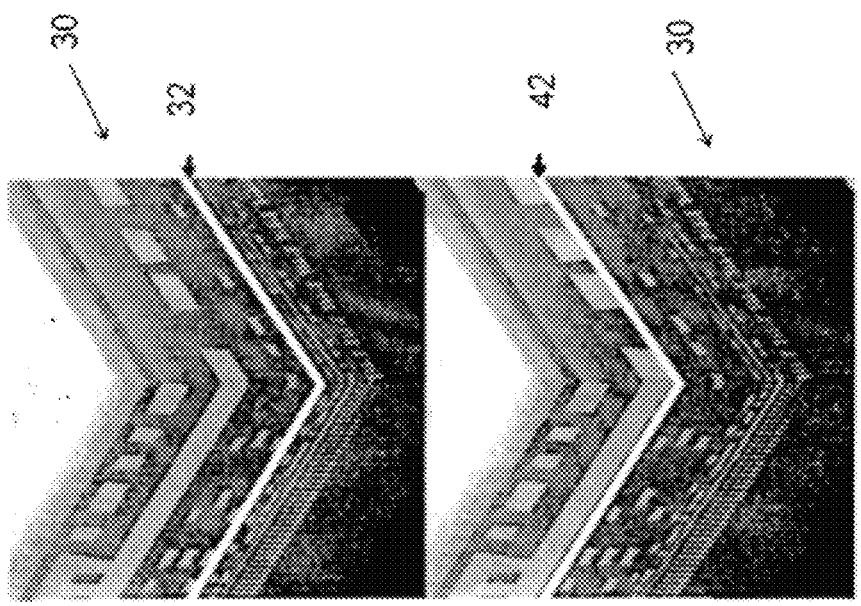
FIG. 1A and 1B illustrates an exemplary semiconductor (or multifunction) active layer in a BEOL of an IC.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

Referring to FIGS. 1A and 1B, an example of a semiconductor (or multifunction) active layer in a BEOL is shown. The high mechanical strength layer is indicated in the bands 32 and 42 within a Cu BEOL on an integrated circuit 30.

Figure 2:
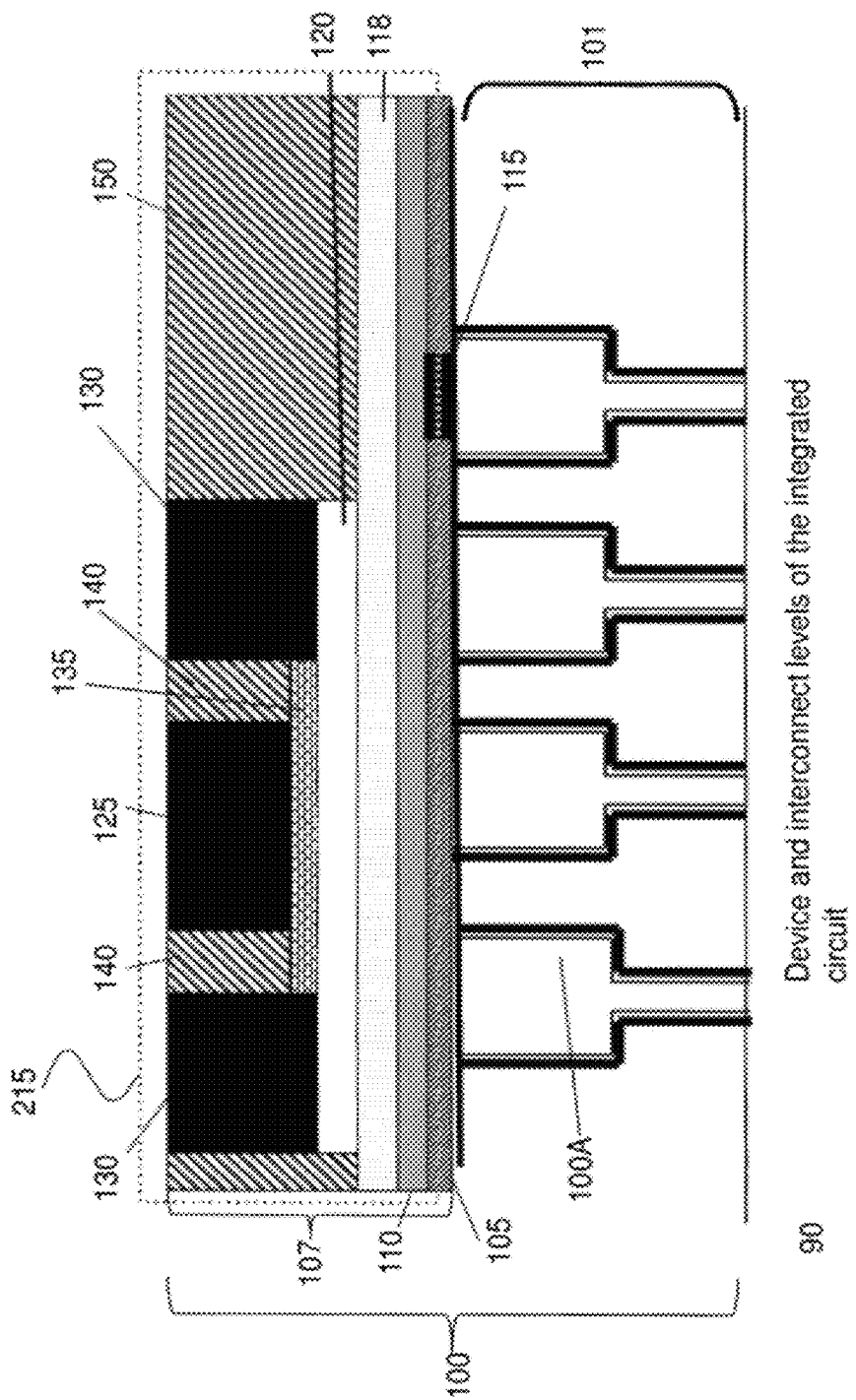
FIG. 2 illustrates an exemplary structure of a BGFET within the semiconductor active layer of an exemplary embodiment of the invention.

Referring to FIG. 2, general features of the active semiconductor layer 107 with high mechanical strength are illustrated. The exemplary embodiment described here provides the active semiconductor layer (or multifunction layer) 107 within the BEOL wiring level of an integrated circuit where the active semiconductor layer 107 includes an Si transistor connected to perform circuit functions or features such as those listed below in functions (1) to (5). The active semiconductor layer 107 can include the active elements or devices, such as but not limited to, the ones listed below for features or functions (1) to (5). For example, the devices can include nonlinear devices.

In an exemplary embodiment, a semiconductor layer is fabricated in the BEOL. The semiconductor layer may include devices, circuits, and a plurality of features or functions including, but not limited to the following list.

One feature or function (1) includes recrystallizing an amorphous layer of silicon, using a process that has a low thermal budget. For example, in an exemplary embodiment, the process of recrystallizing an amorphous layer of silicon includes a nano-second laser process. The same process can be used to activate dopants that were codeposited in with the amorphous silicon. A low-temperature CVD or ALD process can be used to deposit a gate dielectric, in contrast to the more typical very high-temperature oxidation of crystalline Si to form an SiO2 or SiON gate dielectric. These features or functions allow a transistor to be formed or built into the BEOL wiring layers of the IC, with higher carrier mobilities and high On to Off current ratio as compared to amorphous Si transistors formed at similarly low thermal budgets, for example in AMLCD display technology. In an exemplary embodiment of the claimed invention, the transistor formed or built into the BEOL wiring layers of the IC includes at least one switch. The switch may be a FET, a BGFET or another type of switch that is known in the art.

Another feature or function (2) includes an active semiconductor layer, e.g. laser-recrystallized Si and associated doping, gate dielectric, and silicide layers so as to allow devices listed below to be formed at low temperatures compatible with the underlying metal wiring levels.

Another feature of function (3) includes forming or building into the BEOL wiring layers a BGFET. This feature or function allows the On to Off current ratio of the device to be enhanced. Preferably, the voltage thresholds of the BGFET are dynamic. In an exemplary embodiment, when the BGFET is active or turned on, then there is a relatively low threshold. In contrast, when the BGFET is inactive or turned off, then there is a relatively high threshold and, as a result, there will be relatively low leakage current.

Another feature or function (4) includes that within the wiring layer, single or dual damascene Cu vias and/or lines are located to connect the Cu damascene levels above and below. Optionally, a second metal or metal alloy conductor which acts as a Cu diffusion barrier, such as TaN, Ta, TiN, Ti, WN, W, etc., is in contact with Cu, and possibly allowing displaced contacting so as not to place a semiconductor material such as Si or other materials named above in direct contact with Cu. Optionally, multiple layers of these barrier materials may be used.

Yet another feature or function (5) includes circuits fabricated in the wiring layer. The circuits include, but are not limited to, repeater circuits, I/O (input/output) drivers, tamper-resistant circuits, other encoding and reconfigurable circuits, access circuits for memory arrays, image processing accelerator circuits, radiofrequency (RF) signal processing circuits, photonic signal processing circuits, and the like, equivalents or any combination thereof. Once again, this list of exemplary circuits fabricated in the layer is not exhaustive.

The above list of features and functions, provided in the semiconductor layer that is fabricated in the BEOL, is not exhaustive. For example, the list can include features or functions that are equivalent or similar to ones mentioned above. Moreover, a selection from the list of features or functions can be made from any one of the features and functions or any combination thereof.

In further detail, referring gain to FIG. 2, a substrate 90 that contains integrated circuit devices and the integrated circuit devices are connected through a wiring level (or a BEOL metal wiring level) 100. The wiring level 100 may include an active device region 107 and a patterned conductor region 101. The patterned conductor region 101, may include damascene Cu, as well as, other metals within the wiring 101A. The wiring level 100 includes one or more patterned conductors 100A.

Figure 3:
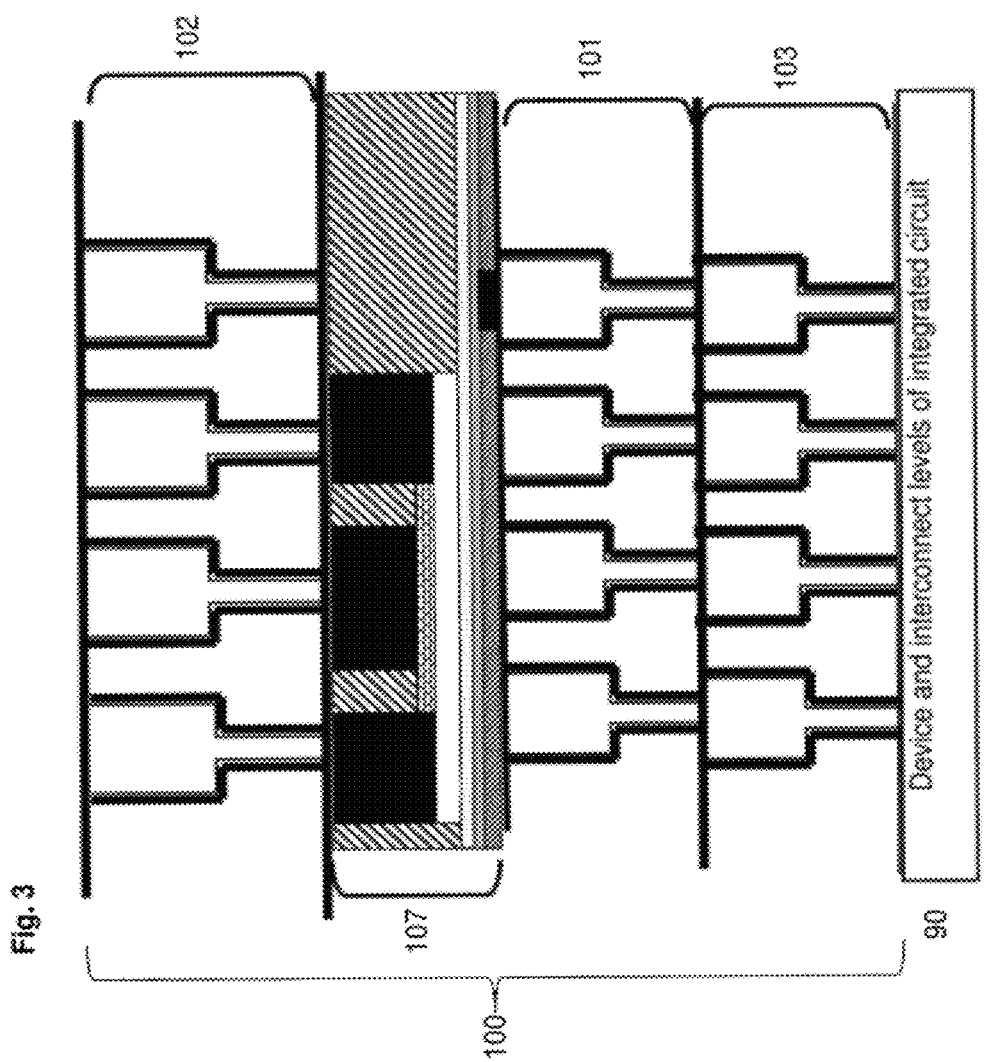
FIG. 3 illustrates an exemplary embodiment of the invention having a plurality of wiring layers.

Optionally, there are a plurality patterned conductor levels, e.g., 101, 102, and 103 of FIG. 3, including within the wiring level 100. Preferably the plurality of patterned conductor levels include damascene Cu. Only one such level, 101 is shown in FIG. 2 as an example (i.e., an interconnect or damascene Cu wiring level 101). The patterned conductor wiring level 101 may be fabricated in a low-k dielectric (either porous or non-porous) having a tensile stress, although other oxide dielectrics having compressive stress may also be used. Herein, the term "silicon nitride" (SiN) is used to include an alloy of silicon and nitrogen, and also an alloy of silicon, carbon, and nitrogen (SiCN), and both these allows may include hydrogen (H).

The wiring patterned conductor wiring level 101 may also be fabricated in a dense oxide dielectric or in a low k dielectric of SiCOH composition. The adhesion strength of the BGFET structure 215 may be higher to oxide than to the SiCO material. The patterned conductor wiring level 101 may be terminated with a semiconductor active device layer 107, which may include sublayers, for example of a semiconductor, a metal, and an insulator.

Referring again to FIG. 2, in an exemplary embodiment, the patterned conductor wiring level 101 is terminated by a semiconductor device layer 107. The semiconductor device layer 107 includes a dielectric 105 terminating the patterned conductor wiring level 101, and a BGFET 215 atop or above the dielectric 105.

Therefore, in order to complete the patterned conductor wiring level 101, a first dielectric layer 105, also known as a Cu cap 105, is provided with the wiring level 100. The first dielectric layer 105 can help prevent a reaction between layers above and below the first dielectric layer 105. Preferably, the first dielectric layer 105 includes a SiN or SiCN alloy. This is because these materials tend to strongly adhere to the Cu in the damascene Cu patterned conductor wiring level 101, and are effective barriers to water, oxygen, and other chemicals that react with Cu. However, other types of dielectrics can be used.

Atop or stacked above the first dielectric layer 105 is a second dielectric layer 150. The second dielectric layer 150 can be made of, for example, SiN or $SiO_2$. The second dielectric layer 150 can be a dielectric with passivation and diffusion barrier properties as well. Embedded within the second dielectric layer 150 is a semiconductor layer or a channel 120. The channel 120 may include Si.

In order to keep the channel 120 isolated from environment and metal contaminants, a dielectric is included above and below (e.g., the dielectrics 150 and 105) the channel 120. Therefore, low density dielectrics are not appropriate, as the dielectrics need to meet certain predetermined barrier requirements. High density dielectrics such as SiNitride or dense SiOxide are preferred.

Atop or stacked above the channel 120 is a gate dielectric 135, a gate 125, and terminals 130. Below the channel 120 is a back dielectric 118, and also a back gate 110 or a fourth terminal. The dielectric 118 acts as the back gate dielectric. Together the terminals 130, the gate 125, the back gate 110, the channel 120 and the first and second dielectrics 150 and 105, formed in the active semiconductor layer 107, form a BGFET, which is attached by the metal wiring 100A in the patterned conductor wiring layer 101.

A via 115 can be placed through the first dielectric layer 105 to make contact with the back gate 110.

The back gate 110, terminals 130 and gate 125 preferably include a conductor selected form a group of conductive materials, e.g., polysilicon or a suitable metal that is able to make contact to the different gates and terminals. The conductor for the back gate 110, terminals 130 and gate 125 can form an ohmic contact.

The terminals 130 and the gate dielectric 135 are disposed on the channel 120. The dielectric 118 acts as the back gate dielectric, and is located between the back gate 110 and the channel 120.

The gate dielectric 135 may include, for example but not limited to, $SiO_2$ or Si or a deposited high dielectric constant insulator, such $HfO_2$, known in the art as a "high k dielectric."

According to one exemplary embodiment, the gate 125 may be modified by adding a sub-layer within the gate 125 to change the interaction of the gate 125 with the conducting channel 120. For example, a ferroelectric material layer is inserted within the gate contact 125. This allows the wiring switch to be operated with a smaller gate voltage.

Above the gate dielectric 135 is a gate contact 125. The contact 130 may be formed to be adjoining side surfaces of the gate dielectric 120. The second dielectric material is disposed between the gate contact 125 and the contacts 130.

The crystal structure of the channel (or Si device layer) 120 is different in other exemplary embodiments. The channel 120 can be crystalline, polycrystalline, or amorphous. The channel can be an alloy of Si (SiC, SiGe, SiGeC), or a compound III-V or II-VI semiconductor. A second wiring level 102 can be included above the semiconductor active layer 107, as shown in FIG. 3. Therefore, there are interconnects both above and below the semiconductor active layer 107 and all the mentioned layers are formed on a single substrate 90.

The semiconductor device layer or channel 120 can be made of low thermal budget process for recrystallization so that the semiconductor, such as Si, can have a crystal structure with desirable semiconductor properties that may be superior to an amorphous Si structure. This crystal structure, through the low thermal budget process for recrystallization, provides the support for the devices fabricated in this layer. The process used for creating the crystal structure is not limited to low thermal budget process for recrystallization, but can be other similar or equivalent processes, so long as they are compatible with any thermal limitations of the existing, underlying wiring levels. For example, methods with a low thermal budget include, but are not limited to, rapid thermal annealing, continuous-wave laser annealing, ultrashort-pulsed laser annealing, pulsed laser annealing using other timescales, and ultraviolet light assisted annealing.

Alternatively, the BGFET may be partially fabricated as a separate wafer, then cut into separate die, and the die are assembled by field assisted fluidic assembly methods.

The Si device layer or channel 120 may have characteristics of a crystalline layer evidenced by narrow X-ray diffraction peaks for the Si lattice and detected by other diffraction methods such as electron diffraction in a transmission electron microscopy (TEM).

The channel (or Si device layer) 120 may be a polycrystalline Si (poly-Si) layer evidenced by broad diffraction peaks in X-ray diffraction and by grain boundaries seen in TEM and by other diffraction methods in a TEM. This layer is formed by deposition of Si followed by a crystallization step, for example pulsed nanosecond laser anneal crystallization. In other embodiments, the first semiconductor layer can be an alloy of Si such as SiC, SiGe, and SiGeC, or a compound semiconductor including but not limited to GaN, InN, AlN GaAs, InGaAs, GaP, InP, ZnO, ternary alloys of these and other materials.

Regarding the active semiconductor layer 107, there can also be sub-layers within or among any of the layers, e.g., 150, 120, 105, within the active semiconductor layer 107. A different sequence of the first dielectric layer 105, the channel (or Si layer) 120 and the second dielectric layer 150 can be provided than the example in FIG. 2 to form the active semiconductor layer. However, preferably there can be a dielectric above and below the channel 120.

The active semiconductor layer 107 is added in the fabrication at the back-end. Therefore, an active layer 107 is fabricated or monolithically integrated during the fabrication of the back-end wiring level 100 including the back-end patterned conductor levels, e.g., 101, 102 and 103.

FIG. 2 illustrates an exemplary embodiment where the structure of a BGFET 215 is formed in the back-end within the active semiconductor layer 107 of the wiring layer 100. While FIG. 2 only illustrates one transistor structure as an example for illustration purposes, a plurality of active devices is typically used, including multiple BGFETs 215, for example an integrated circuit may contain from 10 to 1,000,000 BGFETs, with 100 to 1,000 being used in some preferred embodiments.

The transistor structure of the BGFET 215 is an example of a horizontal or lateral device formed in the active semiconductor layer 107 in the BEOL processing. This structure is not shown to scale and the relative dimensions of the elements may be larger or smaller than depicted.

Figure 4:
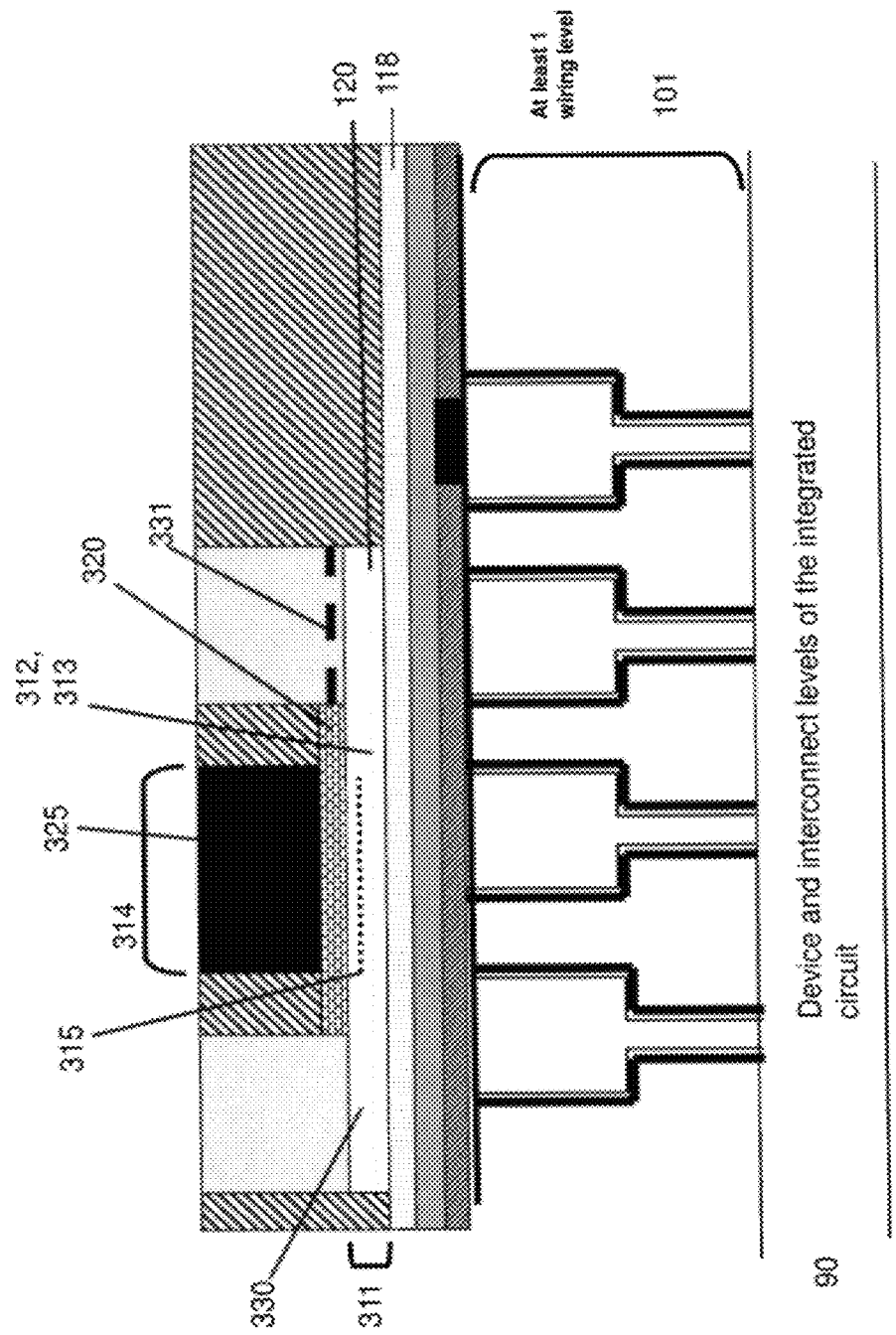
FIG. 4 illustrates a preferred embodiment of the exemplary embodiment of FIG. 2.

One preferred embodiment of this invention is described in reference to FIG. 4 and Table 1. In the preferred embodiment the Si channel (semiconductor) layer 120 has a thickness 31) that is preferably 10-15 nm. In the channel region 120, a preferred dopant concentration 312, is very low, $<1e18\,cm^{-3}$, and it is desired to have a metal concentration 313 in the channel region 120 of $<1e14\,cm^{-3}$.

The gate length 314 is selected by a lithography step and in a preferred embodiment the gate 125 has a length 314 of approximately 50 nm. However, smaller and larger gate lengths 314 may be used within the invention. In some embodiments the gate length is determined by the lithography step that patterns the conductors shown in the figures, with feature size from 50-5000 nm. It is critical to the BGFET function that the area density of interface states ("DIT") 315, be of order $<3e11\,cm^{-2}$. The thickness 320 of the gate dielectric 135 is approximately 4-5 nm in a preferred embodiment, however, smaller and larger gate dielectric thicknesses 320 may be used within the invention.

At the source and drain regions 330 within channel region 120, high dopant concentrations are used such as $1e20\,cm^{-3}$, and N type dopants are preferred such as P, As, or Sb, while P type dopants may be used such as B. A low resistance contact 331 is provided between the channel 120 and the source & drain metallization 130. One aspect of the BGFET is the conductor 325 of the gate 125, which is TiN in a preferred embodiment. Other conductors 325 may be used within the invention, for example highly doped poly-Si, TaN, Ta, and any unreactive conducting material.

TABLE 1

| Item # in FIG. 4 | Description | Preferred value |
|---|---|---|
| 311 | Thickness of channel layer | 10 to 15 nm |
| 312 | Dopant concentration in channel region | $<1\,e18\,cm^{-3}$ |
| 313 | Metal concentration in channel layer | $<1\,e14\,cm^{-3}$ |
| 314 | Gate length | 50 nm |
| 315 | Density of interface states at channel - dielectric interface | DIT $<3e\,11\,cm^{-2}$ |
| 320 | Dielectric thickness | 4-5 nm |
| 330 | Doping at source and drain region | 1 e 20, N type |
| 331 | Contact and barrier between Cu and doped Si | Resistivity spec |
| 325 | Gate conductor material | TiN |

In some embodiments, a plurality of transistors (such as the BGFET formed in the Si active layer 107) are connected in blocks, and the blocks are repeated across the IC area. In contact (e.g., direct contact) to the channel 120 are source and drain terminals 130. Also in contact (e.g., direct contact) to the channel 120 is the back gate 110 and the gate dielectric 135. The source and drain terminals 130 can be formed to be in contact (e.g., direct contact) with the gate dielectric 135. The gate 125 can be formed in contact (e.g., direct contact) with the gate dielectric 135.

In reference to FIGS. 5A to 5F, a method of fabrication of one exemplary embodiment of the BGFET is now described.

In FIG. 5A, the dense dielectric cap 105 is atop the patterned conductor wiring level 101 below. A conductor opening 115 is formed by a single damascene process, then the back gate (BG) material 110 is deposited and patterned into regions. The BG material 110 is preferably highly doped poly Si. In alternate embodiments the BG material 110 may be a metal such as Ta, TaN, Ti, TiN, etc. The BG 110 may be deposited by physical vapor deposition (PVD), plasma enhanced chemical vapor deposition (PECVD), CVD, plasma-enhanced atomic layer deposition (PEALD), ALD, or any related process. A dielectric 118 is deposited atop the back gate 110. The dielectric 118 acts as the gate dielectric 118 for the back gate 110. Preferably, this dielectric layer 118 is selected from $HfO_2$, $Si3N4$, $Al2O3$, $Ta2O5$, $SiO_2$, and other high k oxide dielectrics may be used. Dielectric layer 118 may be deposited by methods such as ALD, PECVD, or any related process.

Figure 5B:
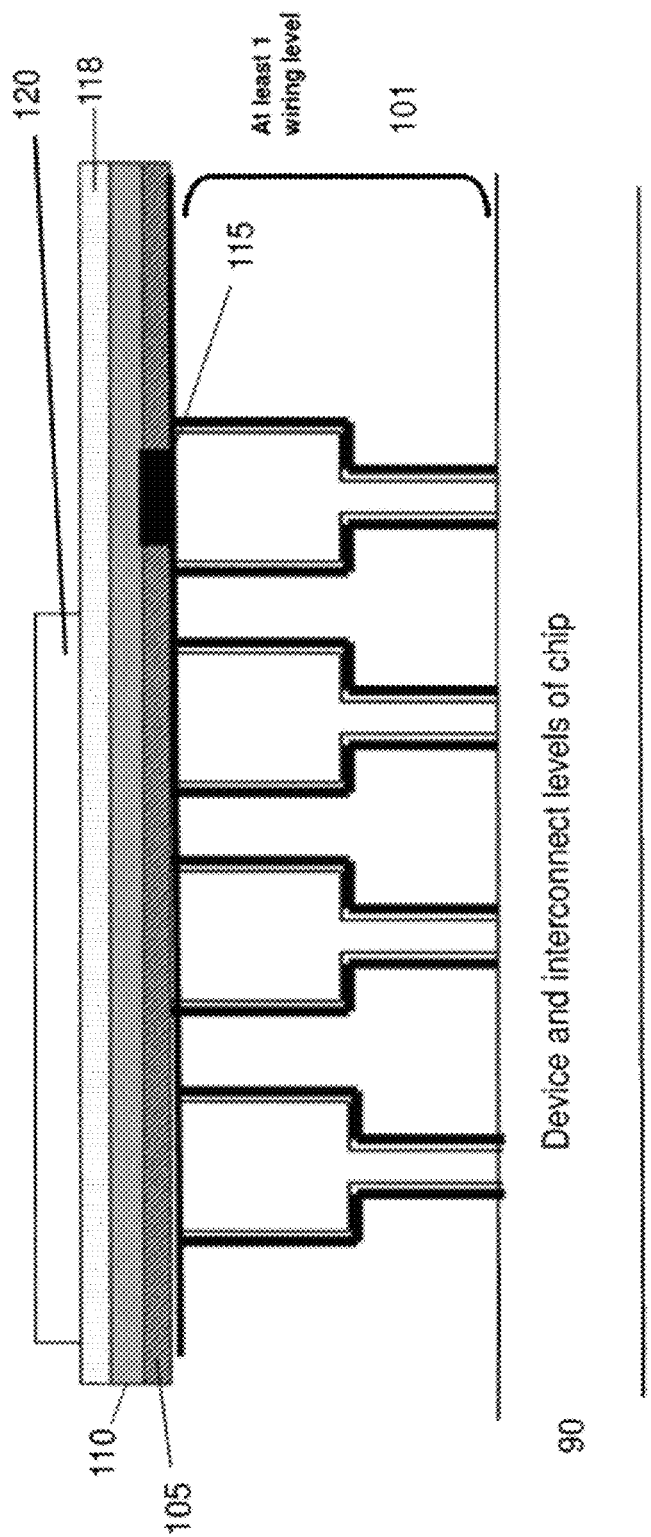

In FIG. 5B, the channel layer 120 is preferably Si, and is patterned into the regions of the BGFET and crystallized by a pulsed nanosecond laser anneal crystallization step, or any related rapid process. In other embodiments, the channel layer 120 may be an alloy of Si such as SiC, SiGe, and SiGeC, or a compound semiconductor. The channel layer 120 is shown after patterning in FIG. 5B. Channel layer 120 is in strong adhesive contact with the dielectric layer 118, and as noted above in Table 1, the channel layer preferably has very low concentration of impurities such as metal atoms.

Figure 5C:
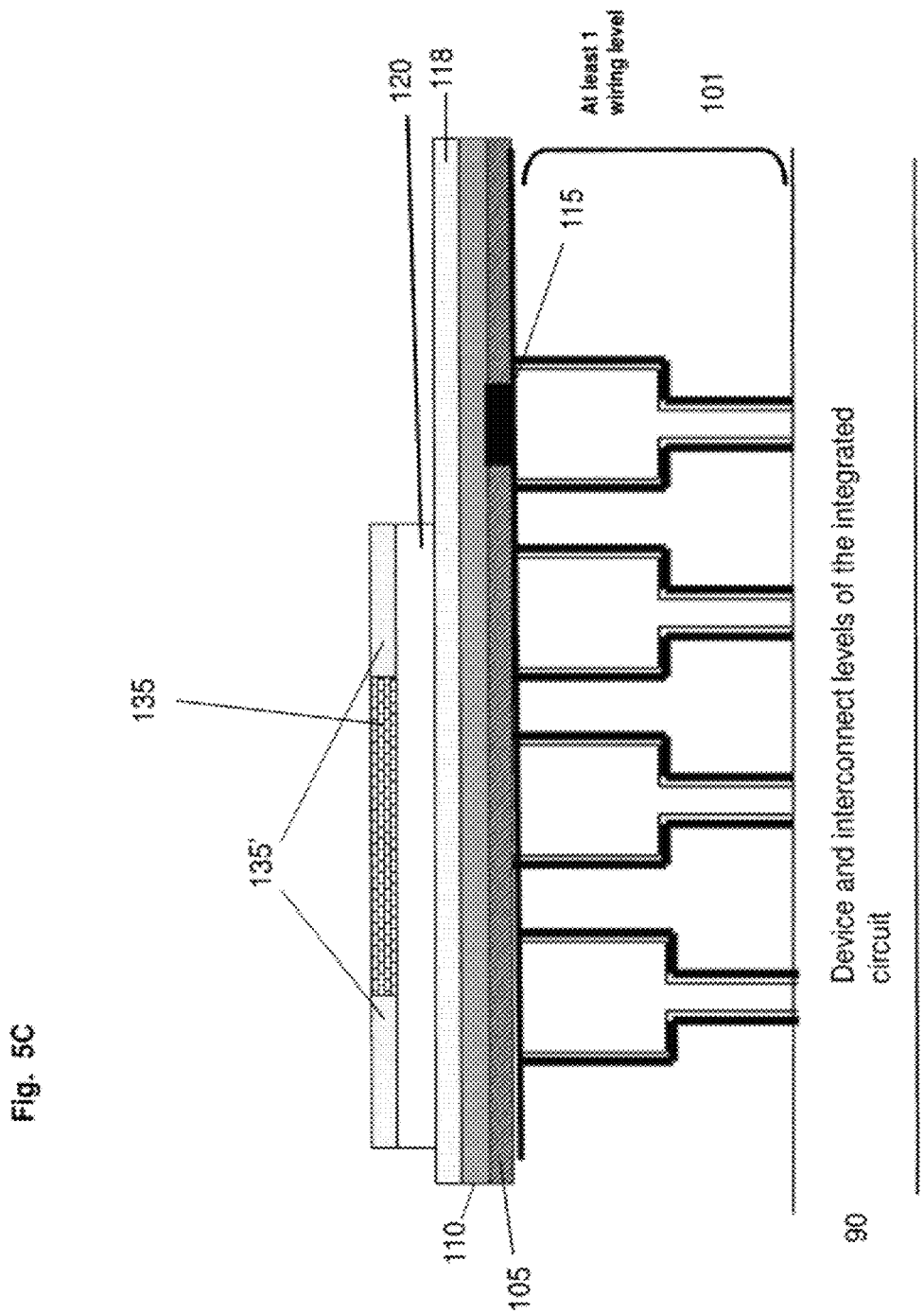

In FIG. 5C, the gate dielectric layer 135 is deposited and is patterned into the regions of the BGFET, with region 135' removed by etching. Preferably, the gate dielectric layer 135 is selected from $HfO_2$, $Si_3N_4$, $Al_2O_3$, $Ta_2O_5$, $SiO_2$, etc., although other high k oxide dielectrics may be used. Gate dielectric layer 135 may be deposited by methods such as ALD, CVD or PVD. As is shown in FIG. 5D, a BEOL dielectric 150 such as $SiO_2$, or a SiCOH material is deposited over the channel layer 120 and gate dielectric layer 135, preferably by PECVD. The BEOL dielectric 150 acts as an insulating spacer and protection layer, and may contain sub-layers which are not shown.

In FIG. 5E, etched openings 130' and 125' are shown in the BEOL dielectric 150. Openings 130' are for the source and drain 130, while the opening 125' is for the gate conductor 125. Lithography may be used to create the pattern and then a reactive ion etch (RIE) may be used to etch the openings 130' and 125' in BEOL dielectric 150. Attention is drawn to 132, showing the bottom interface of the source and drain openings 130'. At location 132, N dopant is placed by implantation, and also a cleaning process is used to remove oxide, C, and other contamination at region 132 prior to the next step, so that low resistance contacts 331 are made to the channel layer 120. To complete the BGFET, metal is placed in openings 130' and 125' and then a chemical mechanical polish (CMP) step is used to planarize the metal into regions 130 and 125, as is shown in FIG. 5F. This is a standard damascene process to form the source and drain conductors 130, and the gate conductor 125. Preferably, these are Cu with a liner layer such as TaN/Ta, as is known in the art. Other metals such as Ta, W, TN, TaN, Ru, and Co may be used in other embodiments. An anneal to activate the dopants, for example, pulsed nanosecond laser anneal is applied, and may be applied after the CMP step, or at a different step in the fabrication.

In reference to FIG. 6, an alternate embodiment is described. FIG. 6 shows one example of a vertical BGFET, in which the transistor structure has an active semiconductor layer 605 on the sidewall of a trench. This structure is not shown to scale and the relative dimensions of the elements may be larger or smaller than depicted. Other vertical BGFET structures may be used within the invention. FIG. 6A is a section view and FIG. 6B is a top down view of the same structure. Referring to both 6A and 6B, a metal liner layer 601 is the back gate of the device. A dielectric 603 isolates the metal liner layer 601 from the active semiconductor layer 605. The active Si channel 605 is deposited, and patterned into the shape shown in FIGS. 6A and 6B, or into a different shape. A gate dielectric 607 is disposed over the active semiconductor layer and the dielectric 603. As is shown in FIG. 6A, a gate terminal 609 is disposed in a trench formed by the gate dielectric 607, and may be completed by a CMP step. As is shown in FIG. 6B, a via contact landing on 609 is item 611 and said contact is provided within the gate terminal 609. Source and drain terminals 613 are provided on a surface of the active Si channel 605. It is noted that the channel region is on the sidewall of the trench, while the source and drain contacts are next to the trench on horizontal contact regions of the Si channel. Locations of the contacts, shapes of each layer and other details are exemplary, and different vertical BGFET structures may be used within the present invention.

Figure 7:
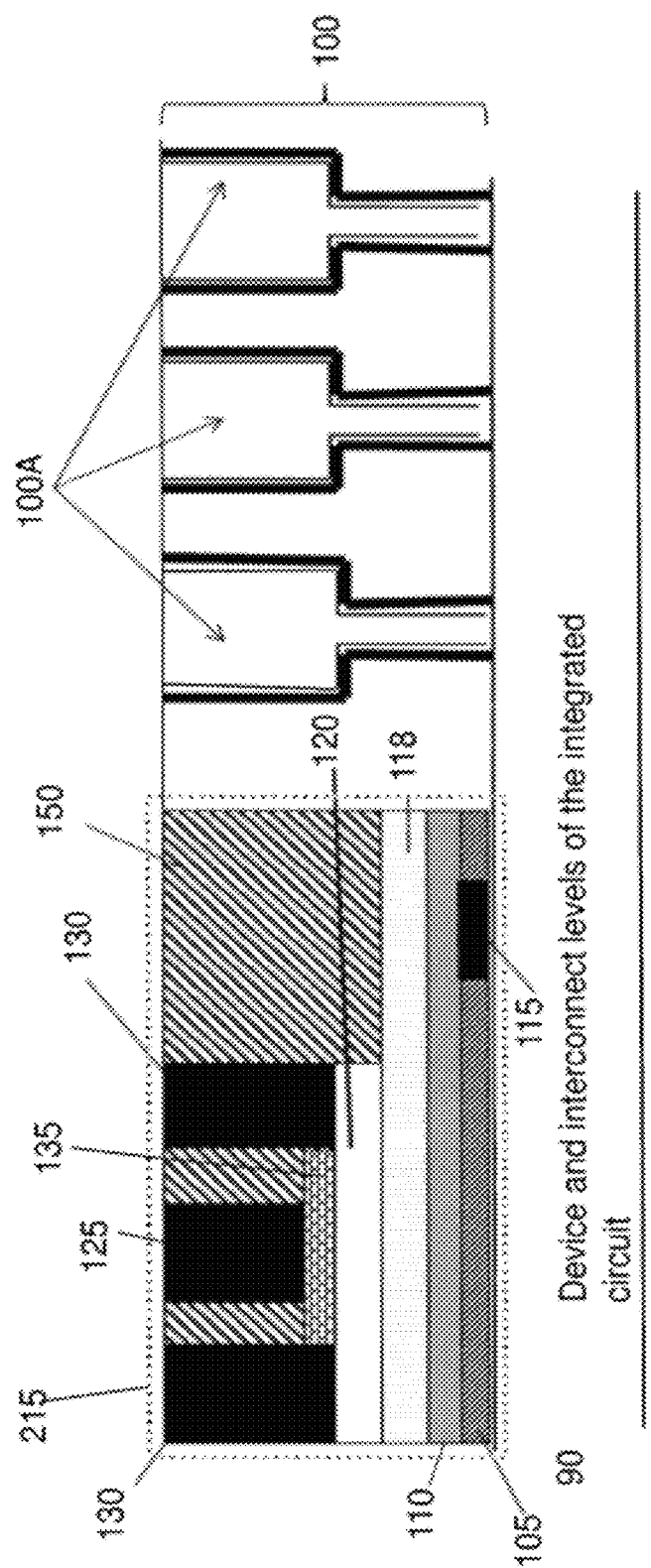
FIG. 7 illustrates an exemplary embodiment where the BGFET switch is provided in a same layer as the patterned conductors.

Referring to FIG. 7, another exemplary embodiment of the present invention is shown. Specifically, in this embodiment a same wiring switch, e.g., BGFET 215, as is shown in FIG. 2, is formed within a same wiring layer 100 as the patterned conductors 101A. In this embodiment, a via 115 can be placed through the first dielectric layer 105 to make contact with the back gate 110. This via 115 enables a connection to be formed between the device and interconnect levels of the substrate the IC 90 and the back gate 110 of the BGFET.

One of ordinary skill in the art would understand that these teachings would allow other active circuits and BGFET devices to be formed and connected in a single integrated circuit, which is based on one Si wafer base layer 90.

The BGFET devices 215 are integrated within the wiring level 100, and optionally between patterned conductor wiring levels 101 or 103 and 102, as opposed to being bonded from a separate substrate. Therefore, the BGFET devices 215 of the present invention are within the patterned conductor wiring levels, e.g., 101, 102 and 103, attached by the metal wiring 101A. Preferably, no bonding interface exists within the BGFET device layer 107 of the present invention.

Conventional circuits do not include active and non-linear devices in the wiring levels. This is because of the temperatures required to form these devices. For example, the formation of a FET requires intense heating to heal, e.g., recrystallize, the damage caused to the silicon by ion implantation during the formation of the FET, as well as to activate the implanted dopants. This intense heat is not compatible with wiring fabrication. Therefore, in contrast to the present invention, conventional circuits provide active and non-linear devices in the FEOL processing, and then later form the wiring interconnections in the BEOL processing. As a result, in conventional circuits, the active and non-linear devices are located under a sealing layer and BEOL connections.

Accordingly, the present invention provides the advantage of forming BGFET devices in the wiring level during the BEOL processing. This benefit allows for the formation of wiring or interconnect switches in the wiring level, which significantly reduces the area of the wiring level when compared to conventional technologies. That is, the length of the wiring paths are reduced, thereby not only lessening the amount of parasitic resistance and capacitance, but also increasing the performance of the device. Hence, the present invention not only provides better performance than conventional technologies, but also does so at a lower cost.

Therefore, based on the foregoing exemplary embodiments of the present invention, the BEOL structures incorporating active devices provide an increased circuit density without reducing performance and reliability.

Referring again to FIG. 2, by forming a wiring switch 215, also known as an interconnect switch, such as the BGFET 215, in the BEOL processing, conductive paths in the wiring interconnections 101A in the patterned conductor wiring layer 101 may be modified based on a voltage received by the wiring switch 215. This allows the present invention to provide an IC with switchable or reconfigurable wiring paths 101A.

By providing a BGFET 215 as the wiring or interconnect switch 215, a high ratio of On to Off current is exhibited. Preferably, the BGFET 215 exhibits an On to Off current ratio of at least $10^4$ (10,000), which is higher than conventional FET structures with a single gate, which do not include a dynamic Vt. Specifically, by providing a BGFET 215, a voltage bias may be applied to both the gate 135 and the back gate 110. This allows for a very high current, when the BGFET 215 is closed (e.g., in a conductive state) by forward biasing the back gate (positive voltage with respect to the source in NI-ET) and for a very low current, when the BGFET 215 is open (e.g., in a non-conductive state) by reverse biasing the back gate (negative voltage with respect to the source). Hence, a dual Vt is achieved (lower in the ON state and higher in the OFF state) allowing for an On to Off current ratio that is higher than that of conventional devices.

Since the BGFET 215 of the present invention has a high On to Off current ratio, it is well suited to be used as a switch for modifying the interconnect wiring paths 101A of the wiring layer 100. Within the present invention, a lower or higher On to Off current ratio may be used, with 10,000 being an example ratio.

Also, by providing the BGFET 215 as a wiring switch 215, the back gate 110 can be used to regulate the Vt of the BGFET 215. Since the BGFET 215 is fabricated in the BEOL processing, the BGFET 215 can have different Vts depending on the back gate bias applied. Conventional devices can have dynamic thresholds achieved by tying the gate and well together so that the biases of the well and gate are same. This helps improve ON-OFF ratio but there is added capacitance penalty, in addition to other parasitic capacitances. Further this dynamic biasing scheme limits the voltage range and type of operation.

When the BGFET 215 of the present invention is closed and forms a connection between the wiring interconnects 101A of the wiring layer 100 a high current in the back gate 110 flows through the BGFET 215. Therefore, it is preferable to back bias the BGFET 215 so that the voltage threshold (Vt) of the device is low. This is achieved by forward biasing the back gate (e.g., applying a positive voltage with respect to the source in an NFET) that reduces carrier confinement. Likewise, when the BGFET 215 is open and a connection between the wiring interconnects is terminated, the back gate 100 is back biased so that the Vt of the device is high. This is achieved by reverse biasing the back gate (e.g., applying a negative voltage with respect to the source in NFET). Since the BGFET 215 has a variable threshold the present invention provides a very effective way to optimize the FET for low power when not in use and high performance when needed.

Additionally, the wiring switch 215 may be a thin body device. By using a thin bodied device in the back end, the channel 120 of the device does not have to be doped. The advantage of providing a thin body device is that the silicon channel 120 can be un-doped and it has very good sub-threshold characteristics necessary for high ON-OFF current ratio, for example 10,000 or larger. Further it has a high sensitivity to the back bias of the back gate 110. This also helps to maintain a high On to Off current ratio.

Figure 8:
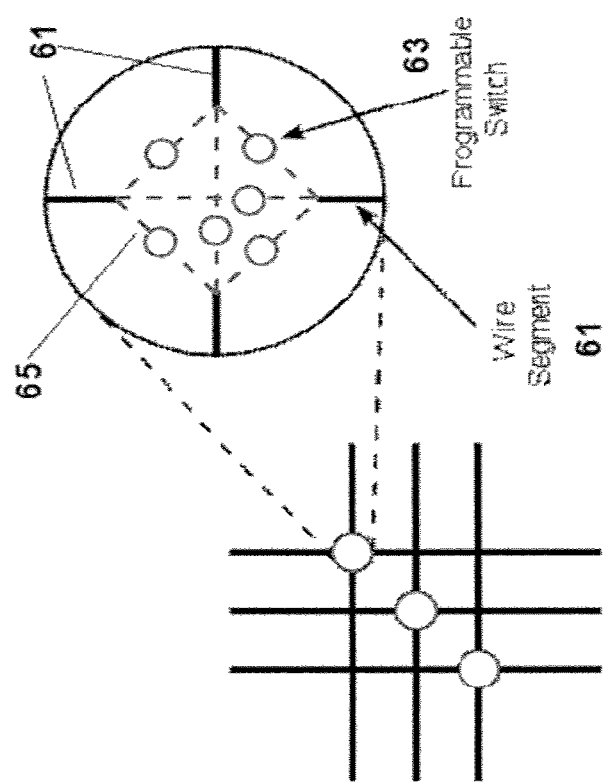
FIG. 8 illustrates an exemplary structure in which the present invention is used.

FIG. 8 shows a wiring structure in which to use the present invention. This type of structure is known to be used in the FEOL processing for basic crystal and silicon devices. The present invention applies this structure to the switch 63, which is provided in the BEOL processing.

For example, in an exemplary embodiment, the wiring switches 215 that are depicted in FIG. 2, are formed in an array 65. Wiring segments 61 enter an array 65, which allows for re-configurable or re-programmable wiring paths. For example, and not by way of limitation, as is shown in FIG. 8, six programmable wiring switches 63 (e.g., same as 215) are depicted in the array 65. By setting each of the six switches 63 to be Open or Closed, the connection of the wiring segments 61 can be set to create a specific conductive path.

This allows the present invention to provide an FPGA, with the switches 63 formed in the BEOL processing. Therefore, the present invention can include an FPGA IC, which can reconfigure the connection paths between logic elements (not depicted) using the wiring switches 63. For example, the wiring switches 63 can include any combination of the BGFET structure as shown in FIG. 2, or a related FET structure, or a different active and/or non-linear device acting as a switch 63.

In an exemplary embodiment, when a BGFET is used as a switch 63, the back gate 110 can be used to regulate the Vt. When the BGFET is closed, then preferably a high current in back gate is applied to the BGFET. Therefore, is preferable to back bias the back gate 110 so that the Vt of the device is low and a high current is delivered. Similarly, when a connection making a wiring route is desired to be terminated, the back gate 110 of the device is biased so that the Vt of the device is high.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

Therefore, based on the foregoing exemplary embodiments of the invention, the BEOL structures incorporating active devices provide an increased circuit density without reducing performance and reliability.

Although examples of the BEOL structures incorporating active devices are shown, alternate embodiments are also possible, including for example, different active devices, different materials, additional sub-layers and additional wiring levels.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An integrated circuit, comprising:
a substrate;
at least one metal wiring layer disposed above the substrate, the metal wiring layer comprising a wiring switch and a plurality of patterned conductors, the wiring switch comprising a back gate field effect transistor (BGFET) configured in a back end of line (BEOL).

2. The integrated circuit according to claim 1, wherein the plurality of patterned conductors in said metal wiring layer further comprise a plurality of interconnects, the wiring switch being attached by the plurality of interconnects, and
wherein the wiring switch comprising the BGFET is formed into BEOL wiring layers.

3. The integrated circuit according to claim 1, wherein the metal wiring layer further comprises damascene copper (Cu).

4. The integrated circuit according to claim 1, wherein the plurality of patterned conductors include patterned conductors disposed in a first layer of patterned conductors and patterned conductors disposed in a second layer of patterned conductors, and
wherein the wiring switch is disposed between the first layer of patterned conductor and the second layer of patterned conductors.

5. The integrated circuit according to claim 1, wherein the wiring switch is disposed in a same layer as the plurality of patterned conductors.

6. The integrated circuit according to claim 1, wherein the wiring switch comprises an un-doped channel.

7. The integrated circuit according to claim 1, wherein BGFET comprises a horizontal structure device.

8. The integrated circuit according to claim 1, wherein the BGFET comprises a vertical structure device.

9. The integrated circuit according to claim 1, wherein the BGFET comprises a gate and a back gate, and the gate and the back gate each being configured to receive a different bias voltage.

10. The integrated circuit according to claim 1, wherein the BGFET has a voltage threshold for modifying the at least one conductive path in the wiring level, the voltage threshold being a dynamic threshold.

11. The integrated circuit according to claim 1, wherein the BGFET comprises a thin bodied BGFET.

12. The integrated circuit according to claim 1, further comprising a field programmable gate array (FPGA) circuit comprising:
   a plurality of wire segments; and
   an array comprising a plurality of interconnections, the plurality of interconnects being connected to the array,
   wherein the plurality of wire segments and the plurality of interconnects form a plurality of reconfigurable conductive paths, and
   wherein the wiring switch is disposed within the array and configured to modify a reconfigurable path of the plurality of reconfigurable paths.

13. The integrated circuit according to claim 1, wherein the wiring switch in the metal wiring layer is formed in a same wiring layer as the plurality of patterned conductors, and
   wherein the wiring switch includes reconfigurable wiring paths.

14. The integrated circuit according to claim 1, wherein the plurality of patterned conductors include patterned conductors disposed in a first layer of patterned conductors and patterned conductors disposed in a second layer of patterned conductors.

15. An integrated circuit, comprising:
   a substrate;
   a patterned conductor wiring layer formed on the substrate;
   a semiconductor active device layer disposed on the patterned conductor wiring layer; and
   a thin bodied switch comprising a back gate field effect transistor (BGFET), the thin bodied switch being fabricated in the semiconductor active device layer and configured in a back end of line (BEOL).

16. The integrated circuit according to claim 15, wherein the semiconductor active layer comprises:
   a first dielectric terminating the patterned conductor wiring layer; and
   a second dielectric disposed above a back gate of the BGFET.

17. The integrated circuit according to claim 15 wherein the BGFET comprises an un-doped channel.

18. The integrated circuit according to claim 17, wherein the patterned conductor wiring layer comprises damascene copper (Cu).

19. The integrated circuit according to claim 15, wherein the patterned conductor wiring layer further comprises a plurality of interconnects, the thin bodied switch being attached by the plurality of interconnects, and
   wherein the thin bodied switch comprising the BGFET is formed into BEOL wiring layers.

20. The integrated circuit according to claim 15, wherein the patterned conductor wiring layer includes patterned conductors disposed in a first layer of patterned conductors and patterned conductors disposed in a second layer of patterned conductors, and
   wherein the thin bodied switch is disposed between the first layer of patterned conductor and the second layer of patterned conductors.

* * * * *